United States Patent
Li et al.

(10) Patent No.: US 8,657,180 B2
(45) Date of Patent: Feb. 25, 2014

(54) BOND PAD ASSESSMENT FOR WIRE BONDING

(75) Inventors: Ming Li, Kwai Chung (HK); Dewen Tian, Hong Kong (HK); Madhukumar Janardhanan Pillai, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 0 days.

(21) Appl. No.: 13/494,499

(22) Filed: Jun. 12, 2012

(65) Prior Publication Data

US 2013/0327812 A1 Dec. 12, 2013

(51) Int. Cl.
*B23K 31/02* (2006.01)
*G01N 3/44* (2006.01)

(52) U.S. Cl.
USPC ......... 228/4.5; 228/180.5; 228/904; 228/103; 73/81; 73/82; 73/83

(58) Field of Classification Search
USPC ......... 228/180.5, 4.5, 904, 103; 73/81, 82, 83
See application file for complete search history.

(56) References Cited

U.S. PATENT DOCUMENTS

| 6,247,355 B1 * | 6/2001 | Suresh et al. ...................... 73/82 |
| 6,752,012 B2 * | 6/2004 | Broz et al. .................. 73/150 R |
| 7,004,372 B2 | 2/2006 | Mayer et al. |

* cited by examiner

*Primary Examiner* — Keith Walker
*Assistant Examiner* — Erin Saad
(74) *Attorney, Agent, or Firm* — Ostrolenk Faber LLP

(57) ABSTRACT

For selecting suitable bonding parameters for forming wire bonds onto bond pads of a substrate, one or more indentations are made onto at least one bond pad of the substrate with an indentation tool by applying a series of predetermined forces onto the at least one bond pad with the indentation tool. A depth-force profile of the substrate is measured comprising a relationship between each predetermined force that is applied and a resultant depth of the indentation made by the indentation tool. An appropriate set of bonding parameters suitable for forming wire bonds on the substrate is determined based on the measured depth-force profile.

6 Claims, 6 Drawing Sheets ized bonding parameters for a bond pad. The method involves carrying out a number of bonding cycles of n=1 to k, whereby a bond force $F_B$ and an ultrasonic variable $P_B$, and if necessary, at least one further bond parameter $G_B$ are each varied in discrete steps within a predetermined range. For each bonding cycle n, after attaching the wire ball to the connection point of an IC chip, the following steps are carried out:

BOND PAD ASSESSMENT FOR WIRE BONDING

FIELD OF THE INVENTION

The invention relates to the bonding of wires to electronic devices, and in particular to the optimization of wire bonding parameters.

BACKGROUND AND PRIOR ART

For many years, wire bonding has been the most preferred method to realize the making of electrical interconnections between electronic devices such as integrated circuits (ICs) and substrates on which the ICs are mounted. The basic process flow is shown in FIG. 1, which illustrates a typical wire bonding method using a bonding tool comprising a capillary 10. The capillary 10 guides a length of bonding wire 12 and is operative to connect the bonding wire 12 to bond pads of electronic devices.

First, an electrical flame-off ("EFO") device 14 forms a free air ball ("FAB") 16 at a tip of the bonding wire 12. The capillary 10 retracts the bonding wire 12 and pulls the FAB 16 to its opening, and then guides the FAB 16 to descend onto a first bond site comprising a first bond pad 18. Force and ultrasonic energy are applied for a predetermined time to convert the FAB 16 into a ball bond 20 between the bonding wire 12 and the bond pad 18. This process is known as ball bonding. The wire is then released and extended from the ball bond 20 by the capillary 10 to a required length, formed into a wire loop and then bonded to another bond site, which comprises a second bond pad 22. A wedge bond 24 is formed at the second bond pad 22 by a process known as wedge bonding. An electrical connection is thus formed between the first and second bond pads 18, 22.

Traditionally, gold wire has been used to conduct wire bonding. In recent years, wire bonding using copper wire has become popular due to its superior mechanical and electrical performance, and low cost. However, copper is harder than gold and is prone to work-hardening during the bonding process, which increases the likelihood of underpad damage to the bond pad where wire bonding is performed. Defects such as pad cracking, peeling and silicon cratering may result.

The bond pad structure of an IC chip may vary widely due to the different possible applications of IC devices. Presently, most IC chips are designed for gold wire bonding. When transitioning to copper wire bonding, many bondability issues such as non-stick on pad ("NSOP"), ball lift, pad lift or underpad damage may be encountered. For a wire bonder which otherwise demonstrates good bonding performance, bondability issues may often be caused (1) by sensitive bond pad designs of the ICs to be bonded, or (2) by wire bonding parameters that are not optimized.

For the bondability issues related to factor (1), the conventional solution is to evaluate the structure of the bond pad by SEM/EDX analysis of a cross-section of the bond pad. However, this solution has some drawbacks. For example, preparation of the sectioned bond pad sample is difficult and time-consuming, and the die structure may also vary with different cross-section positions. It would be advantageous to develop a method to evaluate the bond pad robustness more accurately and within a shorter time.

For the bondability issues related to factor (2), the conventional solution is to optimize the bonding parameters using many bonding cycles to determine the parameters that result in the best bonding result. This approach is time consuming, especially for wire bonding sensitive IC devices.

A prior art approach is disclosed in detail in U.S. Pat. No. 7,004,372 entitled "Method for Determining Optimum Bond Parameters when Bonding with a Wire Bonder" which discloses a method for determining optimized bonding parameters for a bond pad. The method involves carrying out a number of bonding cycles of n=1 to k, whereby a bond force $F_B$ and an ultrasonic variable $P_B$, and if necessary, at least one further bond parameter $G_B$ are each varied in discrete steps within a predetermined range. For each bonding cycle n, after attaching the wire ball to the connection point of an IC chip, the following steps are carried out:

(a) Application of a predetermined bond force $F_{B1}$;
(b) Movement of a capillary out of a bond position in a predetermined horizontal direction during which a current $I_{B,n}$ flowing through a drive that moves the capillary is monitored;
(c) Stopping the movement of the capillary as soon as the current $I_{B,n}$ decreases; and
(d) Determining the maximum current $I_{B,n,max}$ ($F_{B,n}$, $P_{B,n}$, $G_{B,n}$) from the progression of the current $I_{B,n}$($F_{B,n}$, $P_{B,n}$, $G_{B,n}$, t). Then the parameters ($F_{B,n}$, $P_{B,n}$, $G_{B,n}$) from values $I_{B,n,max}$ are determined as optimum bond parameters. $F_{B1}$ is the same for all the shear tests.

The fundamental idea of the aforesaid approach is to evaluate ball shear strength using the maximum drive current when moving the capillary in a horizontal direction. However, this method still requires many bonding cycles for process optimization. It requires a lot of manpower and cost to perform the bonding process optimization before the IC chips and substrates with the said bond pads may be put into production. Furthermore, this method may not be sensitive enough, especially for some bond pads that already have bond pad lift issues, since such bond pad lift is insensitive to shear load but sensitive to wire pull.

SUMMARY OF THE INVENTION

Thus, the invention seeks to provide a method and apparatus for assessing bond pad robustness and to rapidly determine optimized bonding parameters for a given bond pad that is to be bonded.

According to a first aspect of the invention, there is provided a method of selecting suitable bonding parameters for forming wire bonds onto bond pads of a substrate, comprising the steps of: mounting the substrate with respect to an indentation tool; making one or more indentations onto at least one bond pad of the substrate with the indentation tool by applying a series of predetermined forces onto the at least one bond pad with the indentation tool, and measuring a depth-force profile comprising a relationship between each predetermined force that is applied and a resultant depth of the indentation made by the indentation tool; and thereafter determining an appropriate set of bonding parameters suitable for forming wire bonds on the substrate based on the measured depth-force profile.

According to a second aspect of the invention, there is provided an apparatus for selecting suitable bonding parameters for forming wire bonds onto bond pads of a substrate, comprising: an indentation tool; an actuator operative to apply a series of predetermined forces onto at least one bond pad of the substrate with the indentation tool to make one or more indentations onto the at least one bond pad of the substrate; a processor for measuring a depth-force profile comprising a relationship between each predetermined force that is applied and a resultant depth of the indentation made by the indentation tool and for determining an appropriate set of bonding parameters suitable for forming wire bonds on the substrate based on the measured depth-force profile.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which.

DETAILED DESCRIPTION OF THE PREFERRED EMBODIMENT OF THE INVENTION

Figure 1:
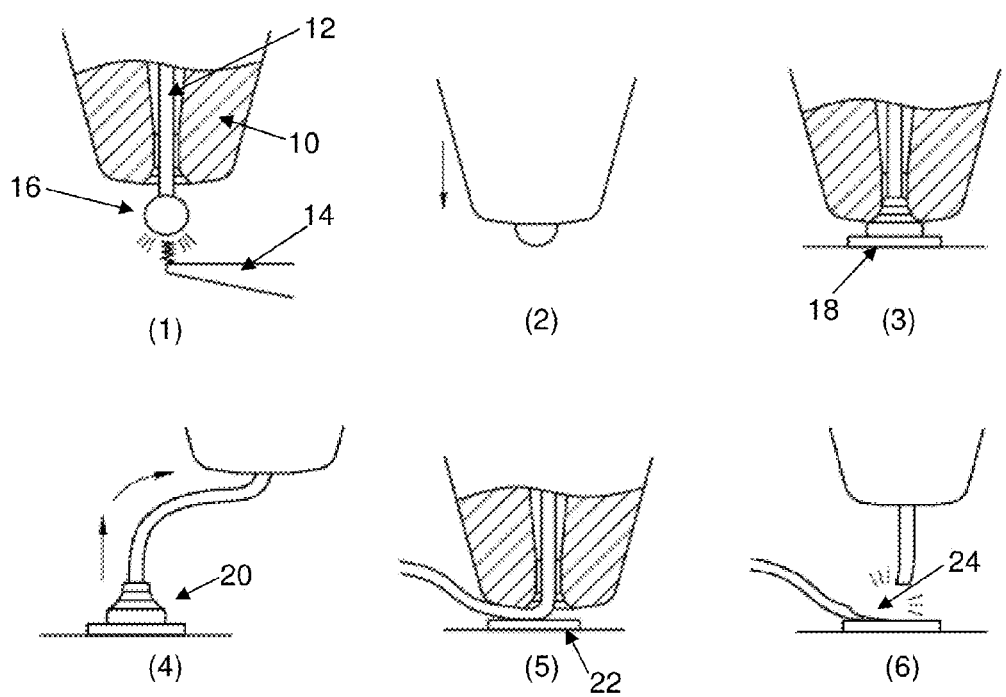
FIG. 1 illustrates a typical wire bonding method using a wire bonding tool comprising a capillary.
Figure 2:
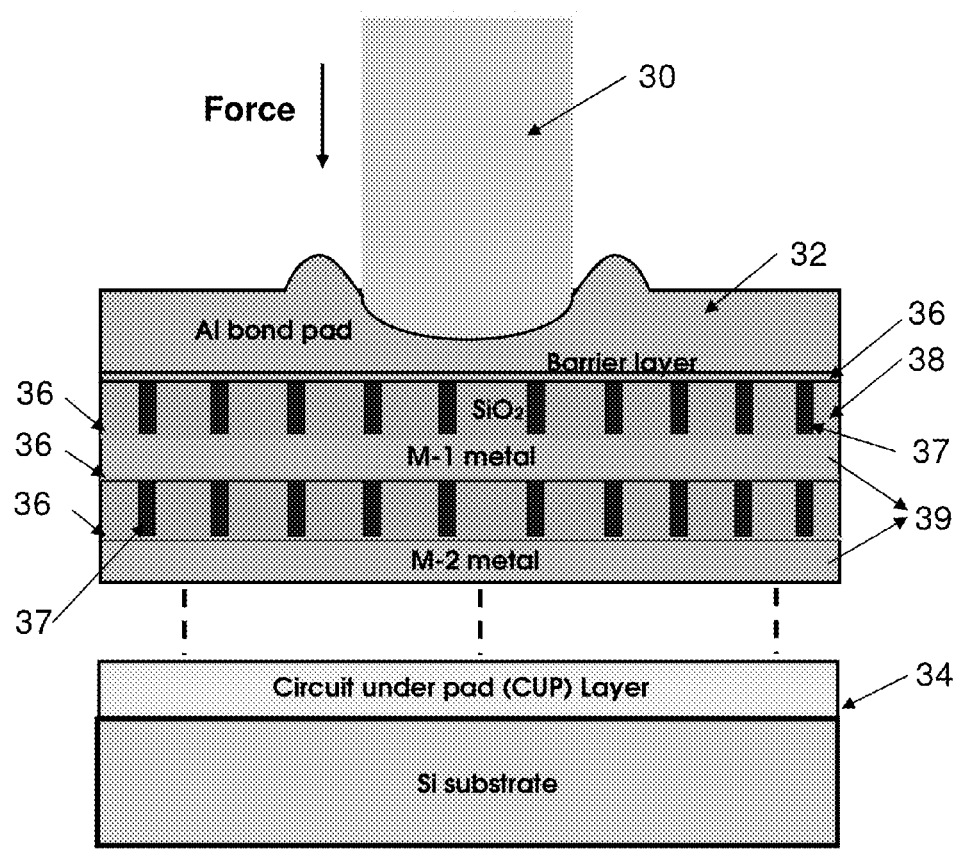
FIG. 2 is a side view of an indentation tool for applying an external force on one or more bond pads of a substrate to be assessed.

FIG. 2 is a side view of an indentation tool 30 for applying an external force on one or more bond pads 32 of a substrate 34, such as an IC chip, to be assessed. The indentation tool 30 assists in the selection of suitable bonding parameters for forming wire bonds onto the bond pads 32 of the substrate 34. The substrate 34 may include the bond pad 32 layer, the barrier layers 36, the interlayer dielectric (ILD) comprising silicon oxide 38, the vias 37, the wiring metals 39 and the silicon substrate of the substrate 34.

Bond pad test methods that are implementable according to the preferred embodiment of the invention are now described. Two preferred methods are specifically described, namely continuous D-F measurement and discrete D-F measurement, which may be used to characterize the bond pads in terms of features such as bond pad robustness.

In the continuous D-F method, the substrate 34 is first mounted with respect to the indentation tool 30. A bond pad 32 of the substrate 34 is then subjected to a continuous external force comprising a series of predetermined forces applied by a solid indentation tool 30 until a target force is reached. An extent of displacement or depth (D) of the indentation tool 30 relative to force (F) applied is recorded during the assessment process, and a curve showing this relationship is constructed. The relationship between each predetermined force that is applied and a resultant depth of the indentation made by the indentation tool 30 may be referred to herein as a depth-force (D-F) Profile (as represented by its D-F curve).

The indentation tool 30 that is used has a tip having a comparable size and shape to an FAB 16. For a solid indentation tool 30 with a sharp shape and small size, it is sensitive to detecting some kinds of bonding failure, such as cracking of a dielectric layer. However, its repeatability may not be very good.

For a tip of an indentation tool 30 with a round shape and large size, it may become insensitive to tiny changes of the structure underneath the indentation tool 30, but the measurement becomes more stable. Hence, a trade-off between the measurement sensitivity and repeatability needs to be considered when the shape of the solid indentation tool 30 is being selected.

Besides the above continuous D-F method, another method that can also be used to construct a D-F curve is the discrete D-F method. In the discrete D-F method, instead of making an indentation onto only one bond pad, different bond pads are subjected to various load values which may be successively increased. The depth of the indentation marks made by the indentation tool 30 can be measured by the displacement (D) of the indentation tool 30 during its loading or unloading process. With the depth values obtained corresponding to each load value, the D-F curve can be plotted. A suitable fitting method, such as a polynomial regression method, can be used to smoothen the curve, thereby eliminating any noise generated. Compared to the continuous D-F method, the discrete D-F method is more useful for checking the underlying damage to the bond pads 32 by optical inspection of the surface of the indentation mark caused by the indentation tool 30. For example, a visible defect such as cracking of a dielectric layer can be observed from the optical image.

There are two ways to measure the depth (D). One way is to measure the cap depth directly, by way of an online record of displacement of the indentation tool or an offline depth measurement. Another way is to utilize a vision module to measure a diameter of the indentation. For an indenter tip with a specific shape, the depth has a defined relationship with the indentation diameter. Thus, the depth can be calculated from the indentation diameter.

The common structural layers from the top to the bottom of a substrate 34 having bond pads 32 are the bond pad 32 layer, the barrier layers 36, the interlayer dielectric (ILD) 38, the vias 37, the wiring metals 39, and the silicon base of the substrate 34. The test method presented above to construct D-F Profiles is an integrated embodiment that takes into account the presence of all these layers. The D-F curves show the deformation resistance of the bond pads. A gradient of the D-F Profile changes with the increase of the force (F) exerted on the bond pads 32 at the depth of the underlying materials. By comparing the indentation depth and the gradient, one can obtain information such as the bond pad hardness, the bond pad thickness, the barrier layer's effect, and so on.

For conventional wire bonders, a displacement control scheme is used before the FAB 16 contacts the bond pad 32. After contact, a force control scheme is used to facilitate ball deformation of the FAB 16 while utilizing a predetermined amount of ultrasonic power. The values of displacement (D) and force (F) to create the D-F Profiles for bond pads 32 of a device can be easily recorded by the modification of such conventional bonding machines by replacing their capillaries 10 with the indentation tool 30. An apparatus that is used for evaluation of bond pad robustness and fast process optimization should also include a database with data comprising D-F Profiles and a related optimized bonding recipe for each D-F Profile, a hardware module that is configured to conduct online measurement to obtain D-F curves using any of the two methods mentioned before, and a vision module for inspecting defects on the surface of the indentation mark. A software program is used in conjunction with a processor to compare the measured D-F curve with the existing D-F Profiles in the database and to generate an appropriate bonding recipe.

Figure 3:
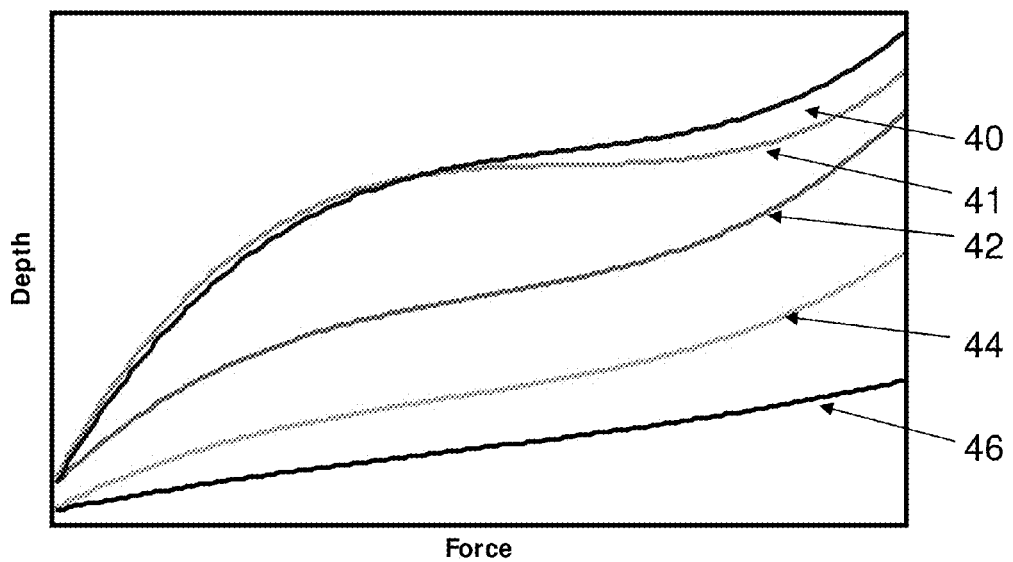
FIG. 3 is a graphical illustration of Depth against Force ("D-F") Profiles of five different types of exemplary bond pads.

FIG. 3 is a graphical illustration of Depth against Force ("D-F") Profiles 40, 41 42, 44, 46 of five different types of exemplary bond pads. For a given load value, the higher the deformation, the softer the bond pad is likely to be. The descending order of thickness values from curve 40 to curve 46 is deducible by comparing the curves. The underlying structure strength can be determined by comparing the gradients of the curves at high loading values. Any abnormal fluctuation in the D-F curve can also indicate that some failure may have occurred during the measurement process.

Figure 4:
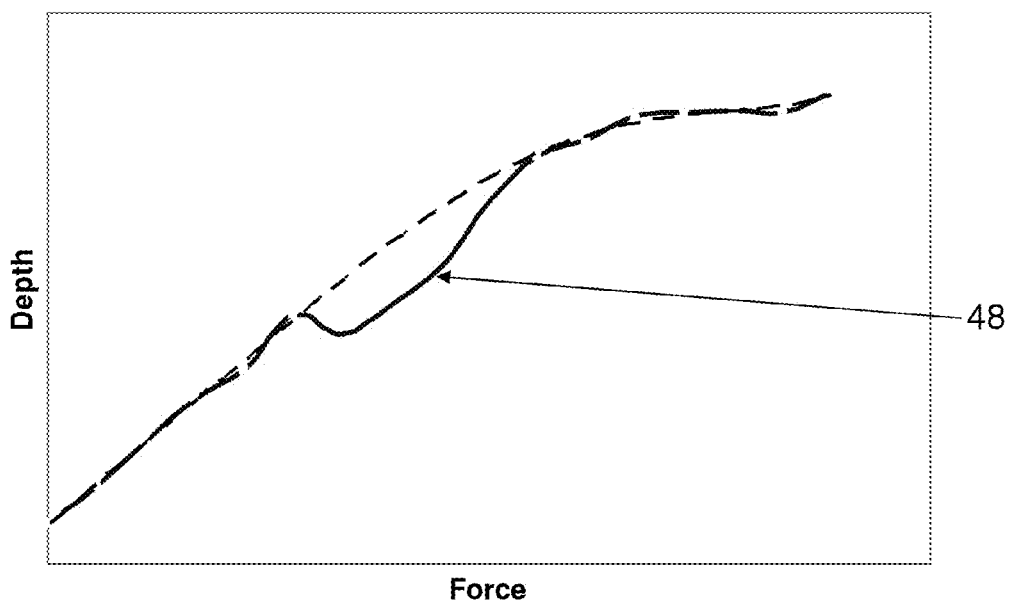
FIG. 4 is a graphical illustration of a D-F Profile that reveals cracking of a dielectric layer at a certain depth.

FIG. 4 is a graphical illustration of a D-F Profile that reveals cracking of a dielectric layer at a certain depth 48. If bond pad failures are found from the D-F Profile and/or the surface inspection of the indentation marks, the failure-related force and displacement values are recorded into the database.

Figure 5:
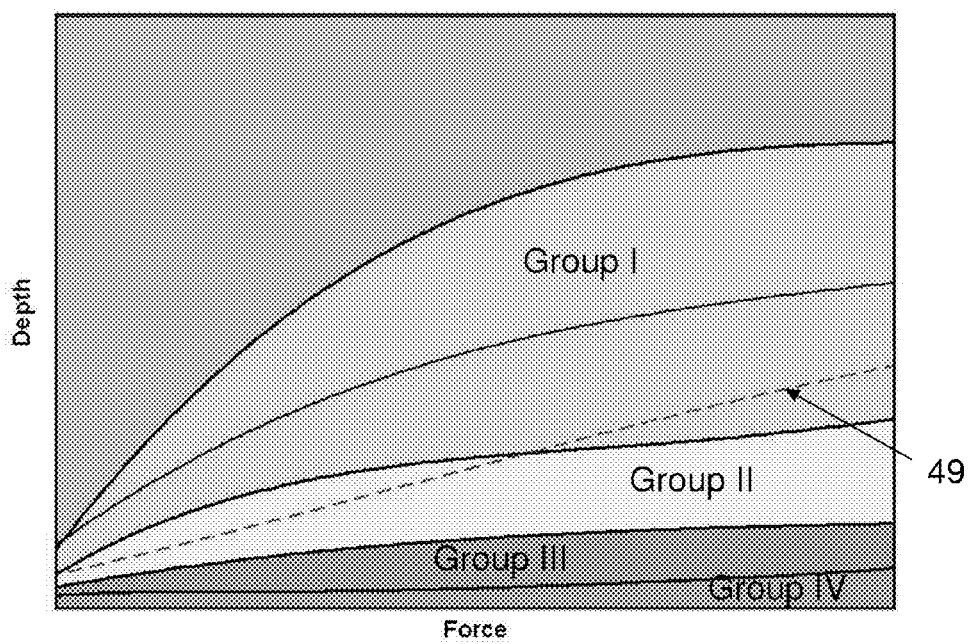
FIG. 5 shows different D-F Profiles which are classified according to bondability.

The deformation behavior of bond pads 32 is related to copper wire bondability. Bondability tests indicate that a certain amount of deformation and aluminum remnants are necessary for a robust wire bond. Inadequate bond pad deformation may cause defects including NSOP or ball lift failure. Conversely, excessive deformation of bond pads 32 may cause underpad damage failure or squeezing-out of aluminum. Based on these observations, the D-F Profile can be classified into several groups. For example, we can rank these classifications from Group I to VI by the bondability of the bond pads 32, as shown in FIG. 5. Group I means that the sample is easily bonded, but aluminum squeeze-out needs to be controlled. Group II means the sample can be bonded with normal parameters. Group III means the sample can be bonded with some special bonding concepts and parameters. Group IV means the sample is very difficult to bond or even cannot be bonded. Therefore the D-F Profiles have been classified to correlate with bondability. The D-F curve 49 shows that the bond pads 32 have reasonable aluminum thickness (Group II), but the slope increases rapidly, which indicates a deformation resistance of the underlayer structure is quite low, hence, the pads are sensitive to damage.

Figure 6:
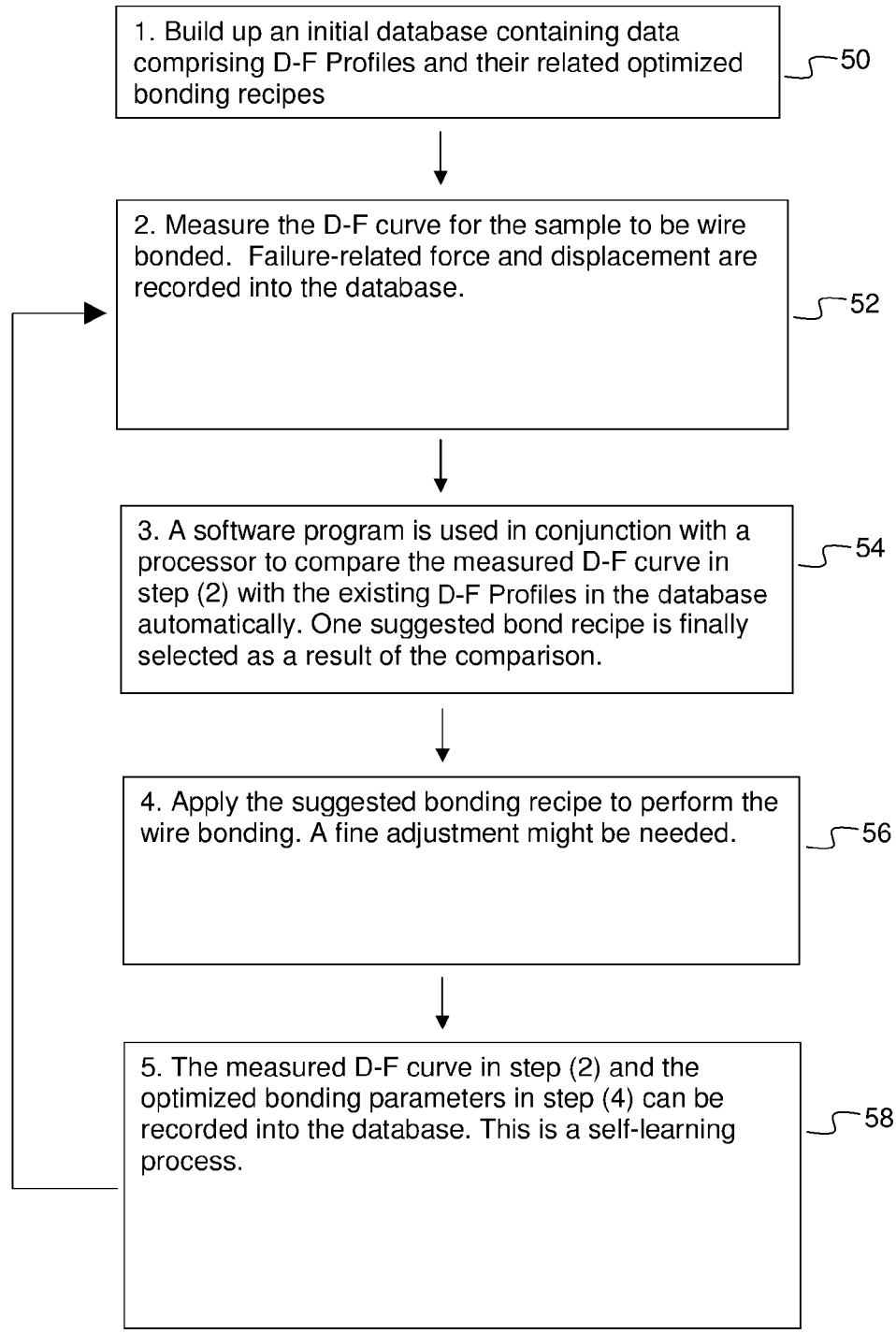
FIG. 6 sets out a method for optimizing bonding parameters based upon bond pad assessments made according to the preferred embodiment of the invention.

FIG. 6 sets out a method for optimizing bonding parameters based upon bond pad assessments made according to the preferred embodiment of the invention. An initial database is first built up containing data comprising different D-F Profiles and their related optimized bonding recipes or bonding parameters 50 which are suitable for use in bonding. The D-F curve for the sample to be wire bonded is measured using the continuous D-F method or discrete D-F method, or both methods. If there are any bond pad failures, the failure-related force and displacement are further recorded into the database 52. A software program is used in conjunction with a processor to automatically compare the measured D-F curve with the existing D-F Profiles contained in the database in order to find the closest match. A suitable bonding recipe or set of bonding parameters is selected as a result of the comparison 54.

During comparison of the measured D-F curve with the D-F Profiles in the existing database, if the measured curve has a similar but not identical shape as a D-F Profile in the existing database, the bonding recipe can be obtained by interpolation of the nearest two curves. If the measured curve is not similar to any D-F Profile in the existing database, an evaluation algorithm is used. The measured D-F curve can be divided into several portions. Each portion is weighted by its contribution to the bond pad's bondability. This contribution may correlate with some bonding parameters. By summing the weights of all the portions, a final score can be obtained. The final score can be compared with the existing database, and finally a suggested bonding recipe can be generated.

The suggested bonding recipe is then applied to perform the actual wire bonding. Fine adjustment may be performed to further optimize the parameters if necessary 56. The further-optimized bonding parameters arising from fine adjustment together with its unique D-F curve that is generated may be recorded into the database, making this is a self-learning process 58.

With the enrichment of the database, the suggested bonding recipe by the software will become increasingly accurate. The time for process optimization will also be greatly reduced.

It should be appreciated that the method and apparatus according to the preferred embodiment of the invention provides an effective way to assess the bond pad structure. The presented D-F methods are operable to evaluate the bond pad 32 structure almost layer-by-layer, since the D-F curve is a total reflection of all layers of the bond pad 32. The bond pad deformation in the presented D-F measurement is comparable to that experienced during actual wire bonding.

By performing the said method, information such as the bond pad hardness, thickness and the underlying layer strength can be obtained. As such, it provides a fast way to locate process optimization parameters by comparing the measured D-F curve with the existing database for matching D-F Profiles.

A further advantage that is gained is that the D-F curve can be used to evaluate the bond pad robustness. When bondability issues are encountered, it is possible to effectively determine the cause of the bondability issues, for instance, whether they are due to wafer fabrication/design or wire bonding process parameters.

There is thus no need to prepare cross-sectional samples for analyzing bond pad structure, which is very time-consuming. As a result, the time taken for optimizing bonding parameters to cater to different structures of bond pads can be greatly reduced. Moreover, minor modifications to the current wire bonder as described above will be effective to enable characterization of bond pad robustness and to rapidly optimize the wire bonding process according to the preferred embodiment of the invention.

The invention described herein is susceptible to variations, modifications and/or additions other than those specifically described and it is to be understood that the invention includes all such variations, modifications and/or additions which fall within the spirit and scope of the above description.

What is claimed is:

1. An apparatus for selecting suitable bonding parameters for forming wire bonds onto bond pads of a substrate, comprising:
   an indentation tool;
   an actuator operative to apply a series of predetermined forces onto at least one bond pad of the substrate with the indentation tool to make one or more indentations onto the at least one bond pad of the substrate;
   a processor for measuring a depth-force profile comprising a relationship between each predetermined force that is applied and a resultant depth of the indentation made by the indentation tool and for determining an appropriate set of bonding parameters suitable for forming wire bonds onto bond pads of the substrate based on the measured depth-force profile; and
   a database that contains different depth-force profiles together with respective sets of bonding parameters suitable for each depth-force profile, whereby the set of bonding parameters suitable for the bond pads of the substrate are obtained by comparing the depth-force profile that has been measured by the processor against the depth-force profiles in the database, wherein the database further includes failure-related values of force and depth detected during indentation of the at least one bond pad of the substrate.

2. An apparatus for selecting suitable bonding parameters for forming wire bonds onto bond pads of a substrate, comprising:

an indentation tool;

an actuator operative to apply a series of predetermined forces onto at least one bond pad of the substrate with the indentation tool to make one or more indentations onto the at least one bond pad of the substrate;

a processor for measuring a depth-force profile comprising a relationship between each predetermined force that is applied and a resultant depth of the indentation made by the indentation tool and for determining an appropriate set of bonding parameters suitable for forming wire bonds onto bond pads of the substrate based on the measured depth-force profile; and a database that contains different depth-force profiles together with respective sets of bonding parameters suitable for each depth-force profile, whereby the set of bonding parameters suitable for the bond pads of the substrate are obtained by comparing the depth-force profile that has been measured by the processor against the depth-force profiles in the database, wherein the depth-force profiles in the database are classified into different groups according to bondability of bond pads exhibiting the respective depth-force profiles.

3. An apparatus for selecting suitable bonding parameters for forming wire bonds onto bond pads of a substrate, comprising:

an indentation tool;

an actuator operative to apply a series of predetermined forces onto at least one bond pad of the substrate with the indentation tool to make one or more indentations onto the at least one bond pad of the substrate; and a processor for measuring a depth-force profile comprising a relationship between each predetermined force that is applied and a resultant depth of the indentation made by the indentation tool and for determining an appropriate set of bonding parameters suitable for forming wire bonds onto bond pads of the substrate based on the measured depth-force profile, wherein the apparatus further comprises a wire bonding machine, and the indentation tool is mounted to replace a capillary of the wire bonding machine.

4. The apparatus as claimed in claim 3, further comprising an optical device that is operative to optically inspect surfaces of the indentations made by the indentation tool for visible defects.

5. The apparatus as claimed in claim 3, wherein the indentation tool has a tip having a similar size and shape as a free air ball produced during wire bonding.

6. The apparatus as claimed in claim 3, further comprising a database that contains different depth-force profiles together with respective sets of bonding parameters suitable for each depth-force profile, whereby the set of bonding parameters suitable for the bond pads of the substrate are obtained by comparing the depth-force profile that has been measured by the processor against the depth-force profiles in the database.

* * * * *